US012748348B2

(12) United States Patent
Lim et al.

(10) Patent No.: US 12,748,348 B2
(45) Date of Patent: Sep. 29, 2026

(54) SEMICONDUCTOR PHOTORESIST COMPOSITION AND METHOD OF FORMING PATTERNS USING THE COMPOSITION

(71) Applicant: Samsung SDI Co., Ltd., Yongin-si (KR)

(72) Inventors: Seol Hee Lim, Suwon-si (KR); Jaebum Lim, Suwon-si (KR); Yaeun Seo, Suwon-si (KR); Sumin Jang, Suwon-si (KR); Soobin Lim, Suwon-si (KR); Minyoung Lee, Suwon-si (KR); Jimin Kim, Suwon-si (KR); Jaeyeol Baek, Suwon-si (KR); Eunmi Kang, Suwon-si (KR); Changsoo Woo, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 856 days.

(21) Appl. No.: 18/155,545

(22) Filed: Jan. 17, 2023

(65) Prior Publication Data

US 2023/0384667 A1 Nov. 30, 2023

(30) Foreign Application Priority Data

May 30, 2022 (KR) ........................ 10-2022-0066265

(51) Int. Cl.
*G03F 7/004* (2006.01)
*C07F 7/22* (2006.01)
(Continued)

(52) U.S. Cl.
CPC .......... *G03F 7/0042* (2013.01); *C07F 7/2224* (2013.01); *H10P 50/692* (2026.01);
(Continued)

(58) Field of Classification Search
CPC ...... G03F 7/0042; G03F 7/004; G03F 7/2004; C07F 7/2224; H10P 50/692; H10P 50/71; H10P 50/73; H10P 76/20; H10P 76/2041
(Continued)

(56) References Cited

U.S. PATENT DOCUMENTS

| | | | |
|---|---|---|---|
| 5,061,599 A | 10/1991 | Kudo et al. |
| 2011/0045406 A1 | 2/2011 | Keszler et al. |

(Continued)

FOREIGN PATENT DOCUMENTS

| | | | |
|---|---|---|---|
| CN | 112666794 A | 4/2021 |
| CN | 113495429 A | 10/2021 |

(Continued)

OTHER PUBLICATIONS

Anderson, Christopher et al.; "The SEMATECH Berkeley MET: extending EUV learning down to 16-nm half pitch"; Proc. of SPIE; vol. 7969; 2011; pp. 79690R-1-79690R-6; SPIEDigitalLibrary.org/conference-proceedings-of-spie; 7pp.

(Continued)

*Primary Examiner* — Caleen O Sullivan
(74) *Attorney, Agent, or Firm* — Womble Bond Dickinson (US) LLP

(57) ABSTRACT

A semiconductor photoresist composition including an organometallic compound represented by Chemical Formula 1 and a solvent and a method of forming patterns using the same are disclosed.

14 Claims, 3 Drawing Sheets

(51) Int. Cl.
*H10P 50/00* (2026.01)
*H10P 76/20* (2026.01)

(52) U.S. Cl.
CPC .............. *H10P 50/71* (2026.01); *H10P 50/73* (2026.01); *H10P 76/20* (2026.01)

(58) Field of Classification Search
USPC ..................... 430/270.1, 271.1, 272.1, 273.1
See application file for complete search history.

(56) References Cited

U.S. PATENT DOCUMENTS

| | | | |
|---|---|---|---|
| 2013/0224652 A1 | 8/2013 | Bass et al. | |
| 2019/0308998 A1 | 10/2019 | Cardineau et al. | |
| 2020/0041896 A1 | 2/2020 | Moon et al. | |
| 2020/0041897 A1 | 2/2020 | Moon et al. | |
| 2021/0087210 A1 | 3/2021 | Chang et al. | |
| 2021/0109442 A1 | 4/2021 | Moon et al. | |
| 2021/0305040 A1 | 9/2021 | Kuo et al. | |
| 2021/0311387 A1 | 10/2021 | Woo et al. | |
| 2021/0356861 A1 | 11/2021 | Han et al. | |
| 2022/0380392 A1* | 12/2022 | Chang .................. | C07F 7/2224 |

FOREIGN PATENT DOCUMENTS

| | | | |
|---|---|---|---|
| CN | 113655689 | A | 11/2021 |
| KR | 10-2014-0121826 | A | 10/2014 |
| KR | 10-2017-0022945 | A | 3/2017 |
| KR | 10-2020-0014043 | A | 2/2020 |
| KR | 10-2020-0014185 | A | 2/2020 |
| KR | 10-2021-0036774 | A | 4/2021 |
| KR | 10-2021-0044591 | A | 4/2021 |
| KR | 10-2021-0044593 | A | 4/2021 |
| KR | 10-2021-0094420 | A | 7/2021 |
| KR | 10-2021-0122679 | A | 10/2021 |
| KR | 10-2021-0128793 | A | 10/2021 |
| KR | 10-2021-0128794 | A | 10/2021 |
| KR | 10-2021-0128795 | A | 10/2021 |
| KR | 10-2021-0138416 | A | 11/2021 |
| TW | 201943724 | A | 11/2019 |
| TW | 202112791 | A | 4/2021 |

OTHER PUBLICATIONS

Sharps, Meredith C. et al.; "Implications of Crystal Structure on Organotin Carboxylate Photoresists"; Cryst. Res. Technol.; 2017; 7pp.
Office Action (including a search report) dated Oct. 3, 2023, of the corresponding Taiwanese Patent Application No. 112105580, 8pp.
Office Action dated Sep. 23, 2024 of the corresponding application Korean Patent Application No. 10-2022-0066265, 6pp.
Notice of Allowance dated May 18, 2025, of the corresponding Korean Patent Application No. 10-2022-0066265; 3pp.
Stowers, Jason K. et al.; "Directly patterned inorganic hardmask for EUV lithography"; Extreme Ultraviolet (EUV) Lithography II; Proceedings of SPIE; 2011; vol. 7969; 796915, 11 pp.
Okamoto, Hiroshi et al.; "Peroxopolytungstic acids: A new inorganic resist material"; Applied Physics Letters; 49; 1986; pp. 298-300.
Chinese Office Action for CN Application No. 202310071780.8, dated Jul. 7, 2026, 8 pages.

* cited by examiner

SEMICONDUCTOR PHOTORESIST COMPOSITION AND METHOD OF FORMING PATTERNS USING THE COMPOSITION

CROSS-REFERENCE TO RELATED APPLICATION

This application claims priority to and the benefit of Korean Patent Application No. 10-2022-0066265 filed in the Korean Intellectual Property Office on May 30, 2022, the entire contents of which are hereby incorporated by reference.

BACKGROUND

1. Field

Embodiments of this disclosure relate to a semiconductor photoresist composition and a method of forming patterns using the same.

2. Description of the Related Art

EUV (extreme ultraviolet) lithography is a technology for manufacturing a next generation semiconductor device. EUV lithography is a pattern-forming technology using an EUV ray having a wavelength of 13.5 nm as an exposure light source. According to EUV lithography, an extremely fine pattern (e.g., less than or equal to 20 nm) may be formed in an exposure process during a manufacture of a semiconductor device.

Extreme ultraviolet (EUV) lithography is realized through development of compatible photoresists which can be performed at a spatial resolution of less than or equal to 16 nm. Currently, efforts to satisfy insufficient specifications of existing chemically amplified (CA) photoresists such as a resolution, a photospeed, and feature roughness (which may also be referred to as a line edge roughness or LER) for the next generation device are being made.

An intrinsic image blurring due to an acid catalyzed reaction in these polymer-type photoresists limits a resolution in small feature sizes, which has been observed in electron beam (e-beam) lithography. Chemically amplified (CA) photoresists are designed for high sensitivity, but because their existing elemental makeups reduce light absorbance of the photoresists at a wavelength of 13.5 nm, and thus, decrease their sensitivity, chemically amplified (CA) photoresists may partially have more difficulties under an EUV exposure.

In addition, CA photoresists may have difficulties in the small feature sizes due to roughness issues, and line edge roughness (LER) of CA photoresists is experimentally observed to be increased, as a photospeed is decreased partially due to an essence of acid catalyst processes. Accordingly, a novel high-performance photoresist is desired in a semiconductor industry because of these defects and problems of CA photoresists.

In order to overcome the aforementioned drawbacks of chemically amplified (CA) organic photosensitive composition, an inorganic photosensitive composition has been researched. Inorganic photosensitive compositions are mainly used for negative tone patterning having resistance against removal by a developer composition due to chemical modification through a nonchemical amplification mechanism. The inorganic composition contains an inorganic element having a higher EUV absorption rate than hydrocarbon, and thus, may secure sensitivity through the non-chemical amplification mechanism and, in addition, is less sensitive with regard to a stochastic effect, and thus, has low line edge roughness and produces a small number of defects.

Inorganic photoresists based on peroxopolyacids of tungsten mixed together with tungsten, niobium, titanium, and/or tantalum have been reported as radiation sensitive materials for patterning.

These materials are effective for patterning large pitches for a bilayer configuration as far ultraviolet (deep UV), X-ray, and electron beam sources. More recently, when cationic hafnium metal oxide sulfate (HfSOx) materials along with a peroxo complexing agent has been used to image a 15 nm half-pitch (HP) through projection EUV exposure, impressive performance has been obtained. This system exhibits the highest performance of a non-CA photoresist and has a practicable photospeed near to that suitable or required for an EUV photoresist. However, the hafnium metal oxide sulfate material having the peroxo complexing agent has a few practical drawbacks. First, these materials are coated in a mixture of corrosive sulfuric acid/hydrogen peroxide and have insufficient shelf-life stability. Second, a structural change thereof for performance improvement as a composite mixture is not easy. Third, development should be performed in a TMAH (tetramethylammonium hydroxide) solution at an extremely high concentration of 25 wt % and the like.

Recently, active research has been conducted into molecules containing tin that have excellent absorption of extreme ultraviolet rays. As for an organotin polymer among them, alkyl ligands are dissociated by light absorption or secondary electrons produced thereby, and are crosslinked with adjacent chains through oxo bonds, and thus, enable the negative tone patterning which may not be removed by an organic developing solution. This organotin polymer exhibits greatly improved sensitivity as well as maintains a resolution and line edge roughness, but the patterning characteristics need to be additionally improved for commercial availability.

SUMMARY

Embodiments of the present disclosure provide a semiconductor photoresist composition having excellent etch resistance and storage stability, and excellent sensitivity and pattern formation properties.

Another embodiment provides a method of forming a pattern using the semiconductor photoresist composition.

The semiconductor photoresist composition according to embodiments includes an organometallic compound represented by Chemical Formula 1 and a solvent.

$$[R^1L^1SnO(R^2L^2C({=}O)O)]_6 \qquad \text{[Chemical Formula 1]}$$

In Chemical Formula 1, $R^1$ and $R^2$ are each independently a substituted or unsubstituted C1 to C20 alkyl group, a substituted or unsubstituted C1 to C20 alkoxy group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C31 arylalkyl group or a combination thereof, and $L^1$ and $L^2$ are each independently a single bond or a substituted or unsubstituted C1 to C10 alkylene group.

In $R^1$ and $R^2$, the substituted C1 to C20 alkyl group, the substituted C1 to C20 alkoxy group, the substituted C3 to C20 cycloalkyl group, the substituted C2 to C20 alkenyl group, the substituted C2 to C20 alkynyl group, the substituted C6 to C30 aryl group or a substituted or unsubstituted C7 to C31 arylalkyl group has at least one hydrogen atom replaced by at least one of a hydroxy group, —NRR' a sulfonyl group, a thiol group, a ketone group, an aldehyde group, a C1 to C20 alkoxy group, or a combination thereof, wherein, R and R' are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group.

The organometallic compound may be represented by Chemical Formula 2.

[Chemical Formula 2]

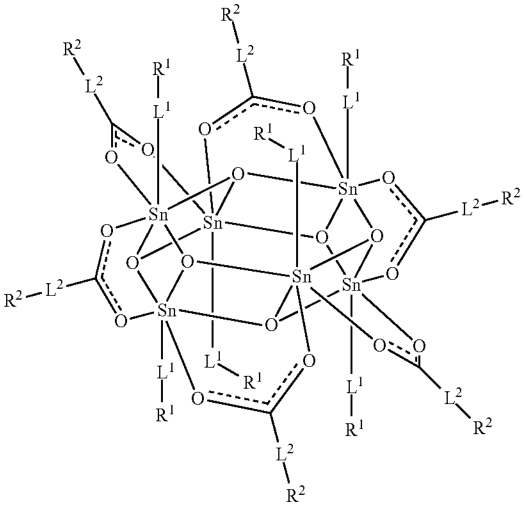

In Chemical Formula 2, $R^1$ and $R^2$ are each independently a substituted or unsubstituted C1 to C20 alkyl group, a substituted or unsubstituted C1 to C20 alkoxy group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C31 arylalkyl group or a combination thereof, and $L^1$ and $L^2$ are each independently a single bond or a substituted or unsubstituted C1 to C10 alkylene group.

$R^1$ and $R^2$ may each independently be a substituted or unsubstituted C1 to C20 alkyl group, a substituted or unsubstituted C1 to C20 alkoxy group, a substituted or unsubstituted C6 to C30 aryl group, a substituted or unsubstituted C7 to C31 arylalkyl group or a combination thereof.

$R^1$ and $R^2$ may each independently be a substituted or unsubstituted C1 to C10 alkyl group or a substituted or unsubstituted C7 to C19 arylalkyl group.

$R^1$ and $R^2$ may each independently be a methyl group, an ethyl group, a propyl group, a butyl group, an isopropyl group, a tert-butyl group, a 2,2-dim ethylpropyl group, a benzyl group, or a combination thereof.

$L^1$ and $L^2$ may each independently be a single bond or a substituted or unsubstituted C1 to C5 alkylene group.

The organometallic compound may include any one of compounds of Group 1 or a combination thereof.

[Group 1]

[Chemical Formula 3]

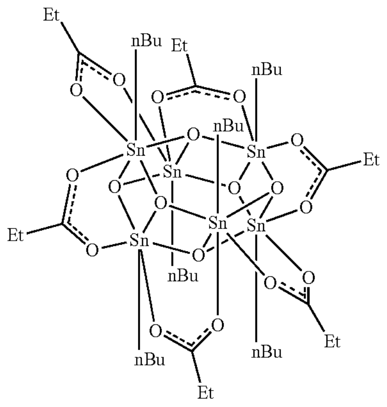

[Chemical Formula 4]

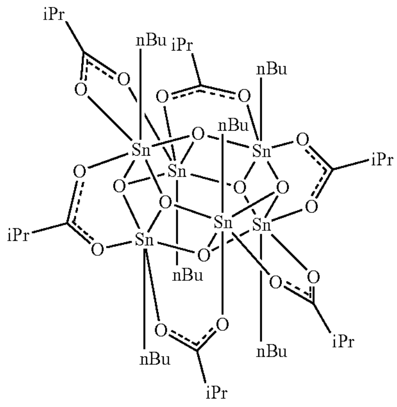

[Chemical Formula 5]

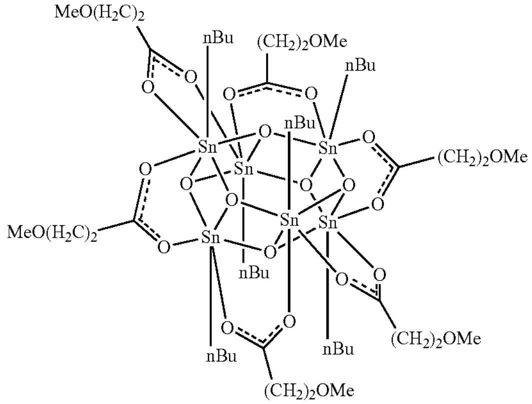

-continued
[Chemical Formula 6]
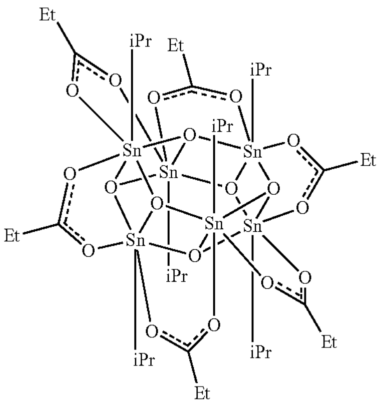
[Chemical Formula 7]
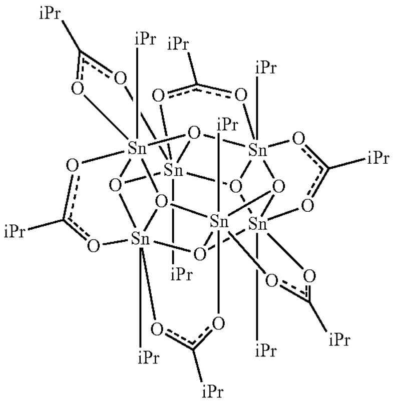
[Chemical Formula 8]
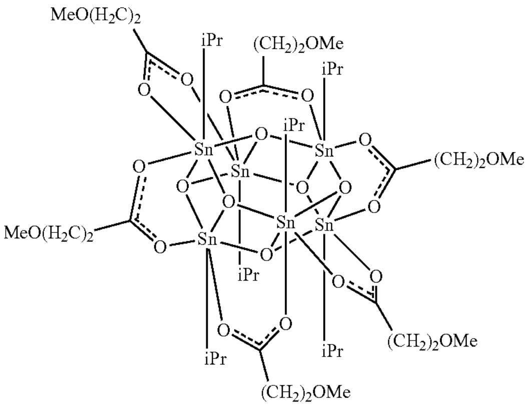
-continued
[Chemical Formula 9]
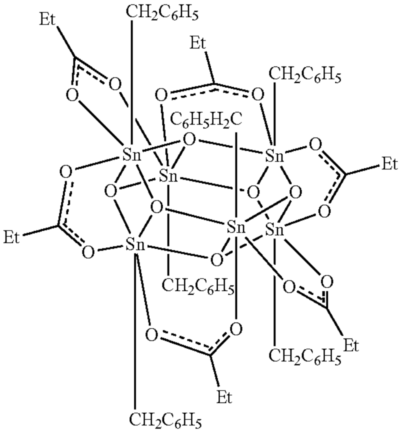
[Chemical Formula 10]
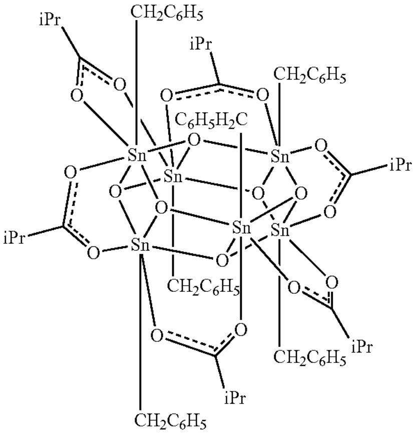
[Chemical Formula 11]
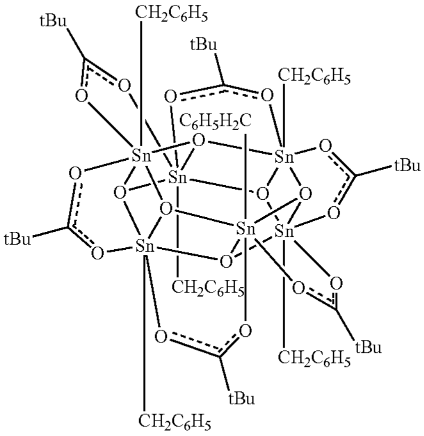

-continued

[Chemical Formula 12]

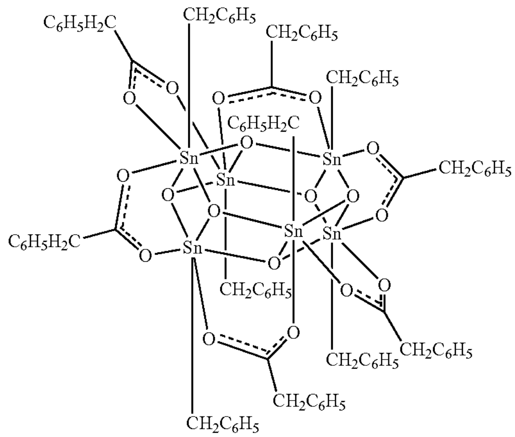

[Chemical Formula 13]

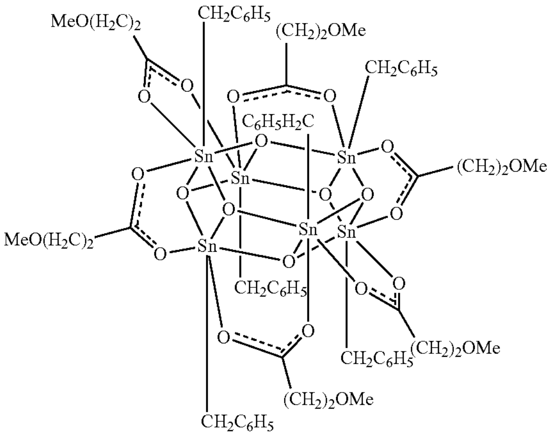

The semiconductor photoresist composition may include about 1 wt % to about 30 wt % of the organometallic compound represented by Chemical Formula 1, based on 100 wt % of the semiconductor photoresist composition.

The semiconductor photoresist composition may further include an additive of a surfactant, a crosslinking agent, a leveling agent, or a combination thereof.

The method of forming patterns according to embodiments includes forming an etching-objective layer on a substrate, coating the semiconductor photoresist composition on the etching-objective layer to form a photoresist layer, patterning the photoresist layer to form a photoresist pattern, and etching the etching-objective layer using the photoresist pattern as an etching mask.

The photoresist pattern may be formed using light having a wavelength of about 5 nm to about 150 nm.

The method of forming patterns may further include providing a resist underlayer formed between the substrate and the photoresist layer.

The photoresist pattern may have a width of about 5 nm to about 100 nm.

The semiconductor photoresist composition according to embodiments has excellent etch resistance and storage stability, and by using it, it is possible to provide a photoresist pattern that has excellent sensitivity and does not collapse even if it has a high aspect ratio.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
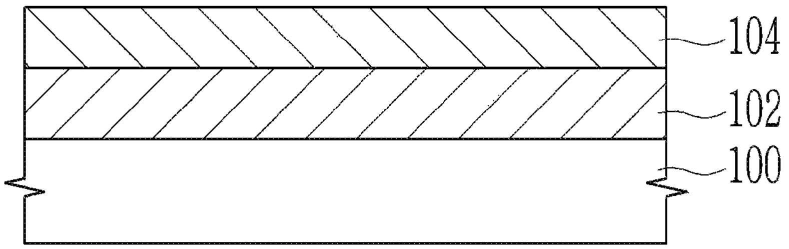
FIGS. 1 to 5 are cross-sectional illustrating a method of forming patterns using a semiconductor photoresist composition according to an embodiment.

Hereinafter, referring to the drawings, embodiments of the present disclosure are described in more detail. In the following description of the present disclosure, well-known functions or constructions will not be described in order to more clearly describe the subject matter of the present disclosure.

In order to clearly illustrate embodiments of the present disclosure, certain description and relationships may be omitted, and throughout the disclosure, the same or similar configuration elements are designated by the same reference numerals. Also, because the size and thickness of each configuration shown in the drawing may be arbitrarily shown for better understanding and ease of description, the present disclosure is not necessarily limited thereto.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

As used herein, "substituted" refers to replacement of a hydrogen atom by deuterium, a halogen, a hydroxy group, a cyano group, a nitro group, —NRR' (wherein, R and R' are independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), —SiRR'R" (wherein, R, R', and R" are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), a C1 to C30 alkyl group, a C1 to C10 haloalkyl group, a C1 to C10 alkylsilyl group, a C3 to C30 cycloalkyl group, a C6 to C30 aryl group, a C1 to C20 alkoxy group, a sulfonyl group, a thiol group, a ketone group, an aldehyde group, or a combination thereof. "Unsubstituted" refers to non-replacement of a hydrogen atom by another substituent such that the hydrogen atom remains.

As used herein, when a definition is not otherwise provided, "alkyl group" refers to a linear or branched aliphatic hydrocarbon group. The alkyl group may be "a saturated alkyl group" without any double bond or triple bond.

The alkyl group may be a C1 to C10 alkyl group. For example, the alkyl group may be a C1 to C8 alkyl group, a C1 to C7 alkyl group, a C1 to C6 alkyl group, or a C1 to C5 alkyl group. For example, the C1 to C5 alkyl group may be a methyl group, an ethyl group, a propyl group, an isopropyl group, an n-butyl group, an isobutyl group, a sec-butyl group, a tert-butyl group, or a 2,2-dimethylpropyl group.

As used herein, when a definition is not otherwise provided, "cycloalkyl group" refers to a monovalent cyclic aliphatic hydrocarbon group.

The cycloalkyl group may be a C3 to C10 cycloalkyl group, for example, a C3 to C8 cycloalkyl group, a C3 to C7 cycloalkyl group, a C3 to C6 cycloalkyl group, a C3 to C5 cycloalkyl group, or a C3 to C4 cycloalkyl group. For example, the cycloalkyl group may be a cyclopropyl group, a cyclobutyl group, a cyclopentyl group, or a cyclohexyl group, but is not limited thereto.

As used herein, "aryl group" refers to a substituent in which all atoms in the cyclic substituent have a p-orbital and these p-orbitals are conjugated and may include a monocyclic or fused ring polycyclic functional group (e.g., rings sharing adjacent pairs of carbon atoms).

As used herein, unless otherwise defined, "alkenyl group" refers to an aliphatic unsaturated alkenyl group including at least one double bond as a linear or branched aliphatic hydrocarbon group.

As used herein, unless otherwise defined, "alkynyl group" refers to an aliphatic unsaturated alkynyl group including at least one triple bond as a linear or branched aliphatic hydrocarbon group.

Hereinafter, a semiconductor photoresist composition according to some embodiments is described.

The semiconductor photoresist composition according to embodiments of the present disclosure includes organometallic compound and a solvent, wherein the organometallic compound is represented by Chemical Formula 1.

$$[R^1L^1SnO(R^2L^2C(=O)O)]_6 \quad \text{[Chemical Formula 1]}$$

In Chemical Formula 1, $R^1$ and $R^2$ are each independently a substituted or unsubstituted C1 to C20 alkyl group, a substituted or unsubstituted C1 to C20 alkoxy group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C31 arylalkyl group or a combination thereof, and $L^1$ and $L^2$ are each independently a single bond or a substituted or unsubstituted C1 to C10 alkylene group.

The compound represented by Chemical Formula 1 is an organotin compound, wherein tin may intensively absorb extreme ultraviolet (EUV) light at 13.5 nm, and thus, have excellent sensitivity regarding light having high energy (e.g., has excellent sensitivity with respect to EUV light). Accordingly, the organotin compound according to embodiments of the present disclosure may exhibit superior stability and sensitivity as compared with other organic and/or inorganic resists.

In some embodiments, the organometallic compound represented by Chemical Formula 1 is a drum-type oxide compound (e.g., an oxide compound having a drum molecular structure), and due to structural stability of the compound, stability with respect to water/moisture may be improved, and storage stability and solubility of the semiconductor photoresist composition including the same may be improved. In addition, the photoresist pattern to which it is applied may exhibit excellent sensitivity and limit resolution as well improved etch resistance due to improved thermal stability.

In $R^1$ and $R^2$, "substituted" may refer to replacement of a hydrogen atom by at least one of a hydroxy group, —NRR' (wherein, R and R' are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), a sulfonyl group, a thiol group, a ketone group, an aldehyde group, a C1 to C20 alkoxy group, and a combination thereof.

The organometallic compound may be, for example, represented by Chemical Formula 2 as a drum type oxide compound (e.g., an oxide compound having a drum molecular structure, which may also be referred to as a drum-shaped structure).

[Chemical Formula 2]

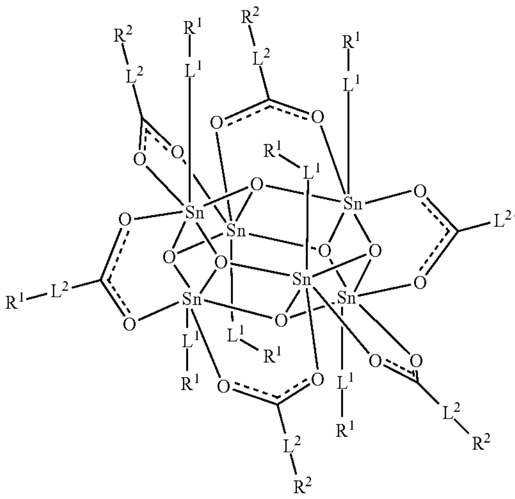

In Chemical Formula 2, $R^1$ and $R^2$ are each independently a substituted or unsubstituted C1 to C20 alkyl group, a substituted or unsubstituted C1 to C20 alkoxy group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C31 arylalkyl group or a combination thereof, and $L^1$ and $L^2$ are each independently a single bond or a substituted or unsubstituted C1 to C10 alkylene group.

$R^1$ and $R^2$ may each independently be a substituted or unsubstituted C1 to C20 alkyl group, a substituted or unsubstituted C1 to C20 alkoxy group, a substituted or unsubstituted C6 to C30 aryl group, a substituted or unsubstituted C7 to C31 arylalkyl group or a combination thereof.

For example, $R^1$ and $R^2$ may each independently be a substituted or unsubstituted C1 to C10 alkyl group, a substituted or unsubstituted C1 to C10 alkoxy group, a substituted or unsubstituted C6 to C18 aryl group, a substituted or unsubstituted C7 to C19 arylalkyl group or a combination thereof.

The substituted or unsubstituted C1 to C10 alkyl group may be, for example, a methyl group, an ethyl group, a propyl group, a butyl group, an isopropyl group, a tert-butyl group, a 2,2-dimethylpropyl group, a benzyl group, or a combination thereof.

The substituted or unsubstituted C1 to C10 alkoxy group may be, for example, a methoxy group, an ethoxy group, a propoxy group, or a combination thereof.

The substituted or unsubstituted C6 to C18 aryl group may be, for example, a phenyl group, a tolyl group, a xylene group, or a combination thereof.

In some embodiments, $R^1$ and $R^2$ may each independently be a substituted or unsubstituted C1 to C10 alkyl group.

For example, $L^1$ and $L^2$ may each independently be a single bond or a substituted or unsubstituted C1 to C5 alkylene group.

For example, the organometallic compound may be any one of compounds of Group 1 or a combination thereof.

[Group 1]

[Chemical Formula 3]

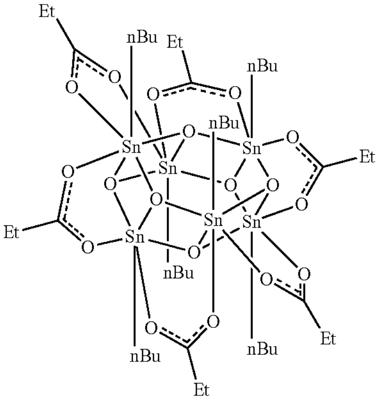

[Chemical Formula 4]

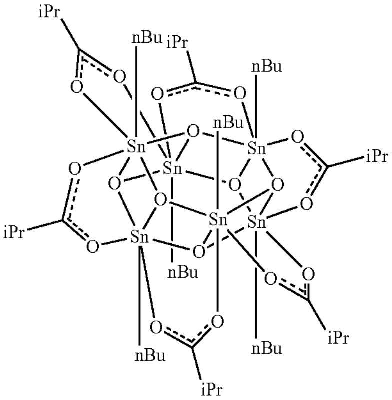

[Chemical Formula 5]

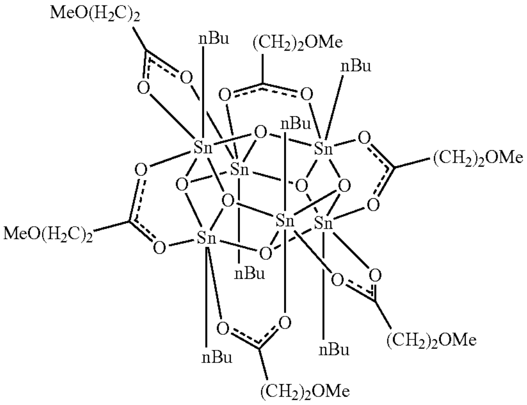

-continued

[Chemical Formula 6]

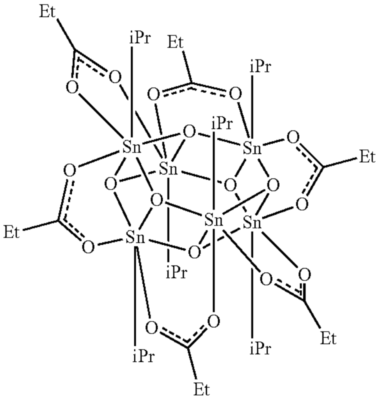

[Chemical Formula 7]

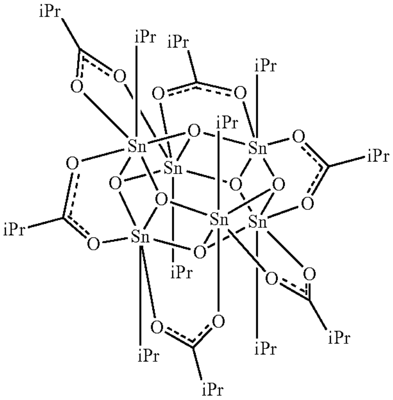

[Chemical Formula 8]

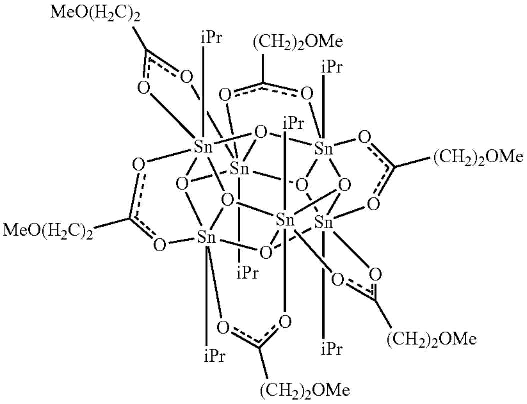

-continued

[Chemical Formula 9]

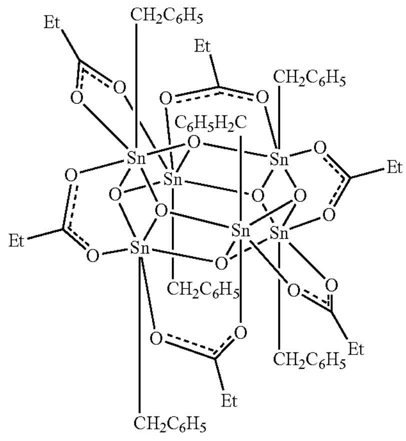

[Chemical Formula 10]

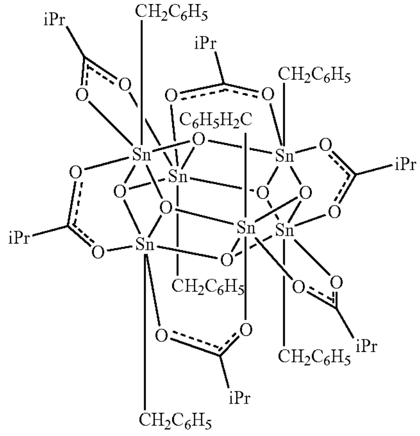

[Chemical Formula 11]

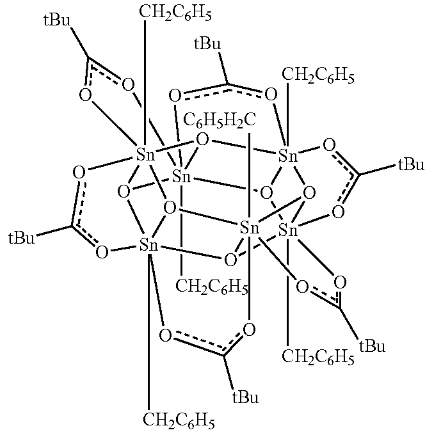

-continued

[Chemical Formula 12]

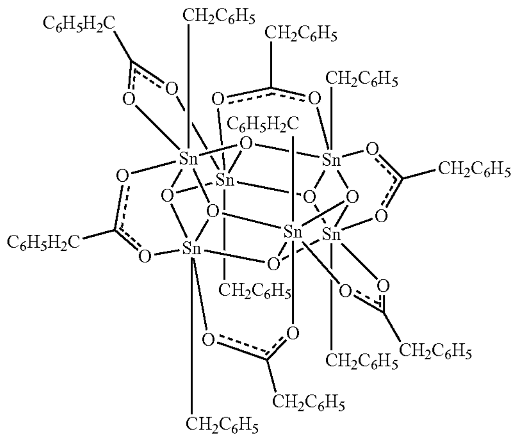

[Chemical Formula 13]

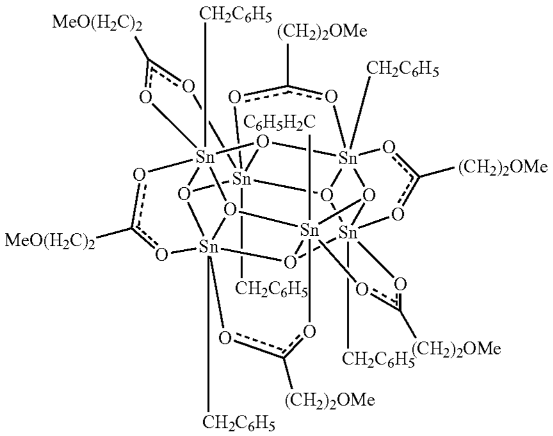

A generally-used organic resist has insufficient etch resistance, and thus, a pattern having a high aspect ratio may collapse.

On the other hand, another inorganic resist (e.g., a metal oxide compound) uses a mixture of sulfuric acid having high corrosiveness and hydrogen peroxide, and thus, is difficult to handle and has insufficient storage-stability, is relatively difficult to structurally change for performance improvement as a composite mixture, and should use a developing solution having a high concentration.

On the contrary, as the semiconductor resist composition according to embodiments includes the drum-type organometallic compound as described above (e.g., an organometallic compound having a drum molecular structure), stability of the compound itself, such as thermal stability and storage stability, is increased, and thus, it has relatively good sensitivity and resolution and is easy to handle compared with existing organic and/or inorganic resists.

In the semiconductor photoresist composition according to some embodiments, the organometallic compound represented by Chemical Formula 1 may be included in an amount of about 1 wt % to about 30 wt %, for example, about 1 wt % to about 25 wt %, for example, about 1 wt % to about 20 wt %, for example, about 1 wt % to about 15 wt %, for example, about 1 wt % to about 10 wt %, for example, about 1 wt % to about 5 wt % based on the total weight of the composition, but is not limited thereto. When the organometallic compound represented by Chemical Formula 1 is included in an amount within the above range, storage stability and etch resistance of the semiconductor photoresist composition are improved, and resolution characteristics are improved.

The solvent of the semiconductor resist composition according to embodiments may be an organic solvent, and may be, for example, aromatic compounds (e.g., xylene, toluene, etc.), alcohols (e.g., 4-methyl-2-pentenol, 4-methyl-2-propanol, 1-butanol, methanol, isopropyl alcohol, 1-propanol), ethers (e.g., anisole, tetrahydrofuran), esters (n-butyl acetate, propylene glycol monomethyl ether acetate, ethyl acetate, ethyl lactate), ketones (e.g., methyl ethyl ketone, 2-heptanone), or a mixture thereof, but is not limited thereto.

In some embodiments, the semiconductor resist composition may further include a resin in addition to the organometallic compound and the solvent.

The resin may be a phenolic resin including at least one aromatic moiety of Group 2.

[Group 2]

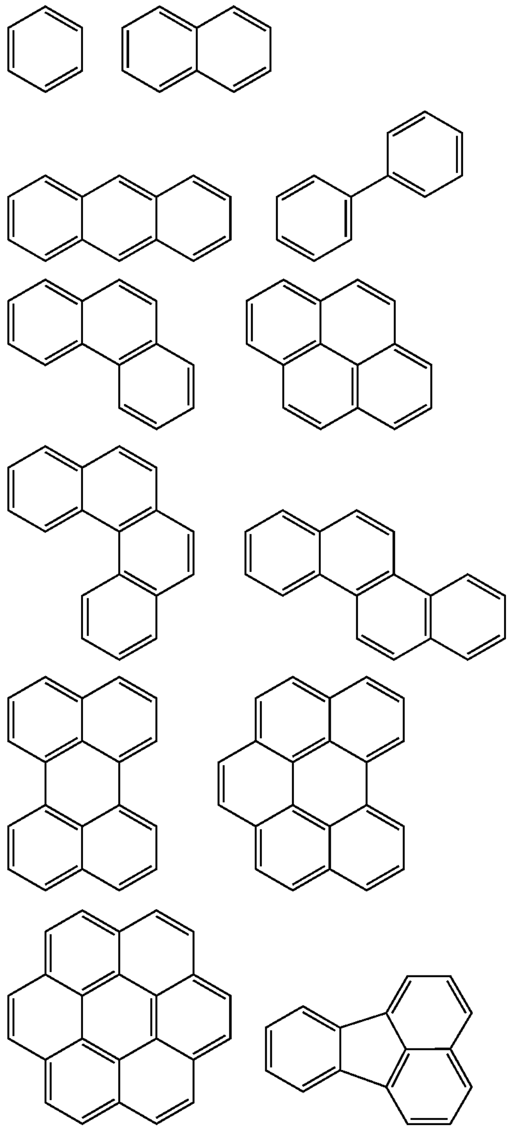

-continued

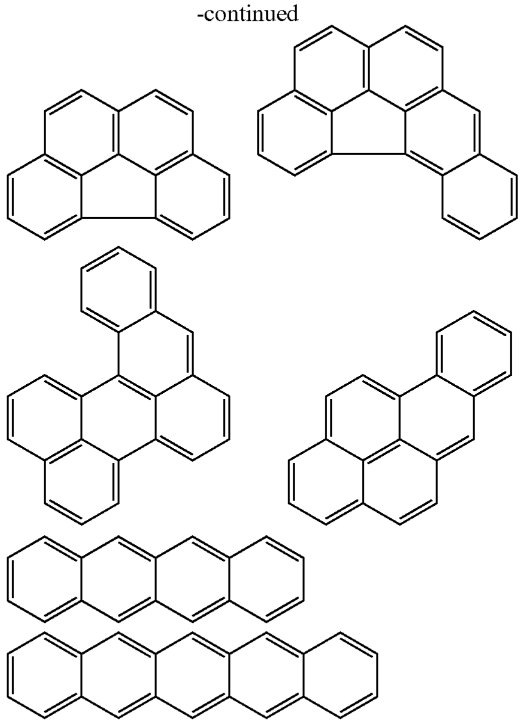

The resin may have a weight average molecular weight of about 500 to about 20,000.

The resin may be included in an amount of about 0.1 wt % to about 50 wt % based on the total amount of the semiconductor resist composition.

When the resin is included in the above content range, it may have excellent etch resistance and heat resistance.

The semiconductor resist composition according to embodiments may consist of the organometallic compound, the solvent, and the resin, or consist essentially of the organometallic compound, the solvent, and the resin such that the semiconductor resist composition includes other components, if at all, only as incidental impurities. However, the semiconductor resist composition according to the embodiment may further include additives as needed or desired. Examples of the additives may include a surfactant, a crosslinking agent, a leveling agent, or a combination thereof.

The surfactant may include, for example, an alkyl benzene sulfonate salt, an alkyl pyridinium salt, polyethylene glycol, a quaternary ammonium salt, or a combination thereof, but is not limited thereto.

The crosslinking agent may be, for example, a melamine-based crosslinking agent, a substituted urea-based crosslinking agent, an acryl-based crosslinking agent, an epoxy-based crosslinking agent, and/or a polymer-based crosslinking agent, but is not limited thereto. The crosslinking agent may have at least two crosslinking forming substituents and may be, for example, a compound such as methoxymethylated glycoluril, butoxymethylated glycoluril, methoxymethylated melamine, butoxymethylated melamine, methoxymethylated benzoguanamine, butoxymethylated benzoguanamine, 4-hydroxybutyl acrylate, acrylic acid, urethane acrylate, acryl methacrylate, 1,4-butanediol diglycidyl ether, glycidol, diglycidyl 1,2-cyclohexane dicarboxylate, trim ethylpropane triglycidyl ether, 1,3-bis(glycidoxypropyl)tetramethyldisiloxane, methoxymethylated urea, butoxymethylated urea, methoxymethylated thiourea, and/or the like.

The leveling agent may be used for improving coating flatness during printing and may be any suitable leveling agent generally used in the art.

A use amount of the additives may be controlled depending on suitable or desired properties.

In addition, the semiconductor photoresist composition may further include a silane coupling agent as an adherence enhancer in order to improve a close-contacting force with the substrate (e.g., in order to improve adherence of the semiconductor photoresist composition to the substrate). The silane coupling agent may be, for example, a silane compound including a carbon-carbon unsaturated bond such as vinyltrimethoxysilane, vinyl triethoxysilane, vinyl trichlorosilane, vinyl tris(β-methoxyethoxy)silane; and/or 3-m ethacryloxypropyltrim ethoxysilane, 3-acryloxypropyltrim ethoxysilane, p-styryl trimethoxysilane, 3-methacryloxypropylmethyldimethoxysilane, 3-methacryloxypropylm ethyl diethoxysilane; trimethoxy[3-(phenylamino)propyl]silane, and/or the like, but is not limited thereto.

The semiconductor photoresist composition may be formed into a pattern having a high aspect ratio without a collapse. Accordingly, in order to form a fine pattern having a width of, for example, about 5 nm to about 100 nm, for example, about 5 nm to about 80 nm, for example, about 5 nm to about 70 nm, for example, about 5 nm to about 50 nm, for example, about 5 nm to about 40 nm, for example, about 5 nm to about 30 nm, or for example, about 5 nm to about 20 nm, the semiconductor photoresist composition may be used for a photoresist process using light having a wavelength in a range from about 5 nm to about 150 nm, for example, about 5 nm to about 100 nm, about 5 nm to about 80 nm, about 5 nm to about 50 nm, about 5 nm to about 30 nm, or about 5 nm to about 20 nm. Accordingly, the semiconductor photoresist composition according to embodiments may be used to realize extreme ultraviolet lithography using an EUV light source of a wavelength of about 13.5 nm.

According to another embodiment, a method of forming patterns using the aforementioned semiconductor photoresist composition is provided. For example, the manufactured pattern may be a photoresist pattern.

The method of forming patterns according to embodiments includes forming an etching-objective layer on a substrate, coating the semiconductor photoresist composition on the etching-objective layer to form a photoresist layer, patterning the photoresist layer to form a photoresist pattern, and etching the etching-objective layer using the photoresist pattern as an etching mask.

Hereinafter, a method of forming patterns using the semiconductor photoresist composition is described referring to FIGS. 1 to 5. FIGS. 1 to 5 are cross-sectional views for explaining a method of forming patterns using a semiconductor photoresist composition according to embodiments.

Referring to FIG. 1, an object for etching is prepared. The object for etching may be a thin film 102 formed on a semiconductor substrate 100. Hereinafter, the object for etching is limited to the thin film 102. A whole surface of the thin film 102 is washed to remove impurities and the like remaining thereon. The thin film 102 may be, for example, a silicon nitride layer, a polysilicon layer, and/or a silicon oxide layer.

Subsequently, the resist underlayer composition for forming a resist underlayer 104 is spin-coated on the surface of the washed thin film 102. However, the embodiment is not limited thereto, and various suitable coating methods, for example, a spray coating, a dip coating, a knife edge coating, a printing method, for example, an inkjet printing and/or a screen printing, and/or the like may be used.

The coating process of the resist underlayer may be omitted, and hereinafter, a process including a coating of the resist underlayer is described.

Then, the coated composition is dried and baked to form a resist underlayer 104 on the thin film 102. The baking may be performed at about 100° C. to about 500° C., or, for example, about 100° C. to about 300° C.

The resist underlayer 104 is formed between the substrate 100 and a photoresist layer 106 (shown in FIG. 2), and thus, may prevent or reduce non-uniformity and pattern-forming capability of a photoresist line width when a ray reflected from the interface between the substrate 100 and the photoresist layer 106 or a hardmask between layers is scattered into an unintended photoresist region.

Figure 2:
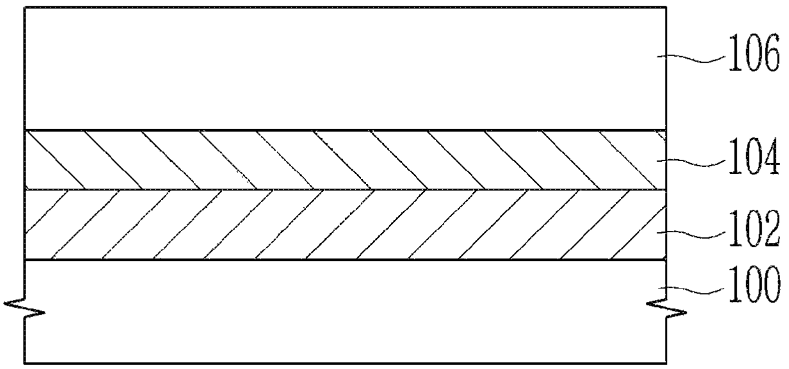

Referring to FIG. 2, the photoresist layer 106 is formed by coating the semiconductor photoresist composition on the resist underlayer 104. The photoresist layer 106 is obtained by coating the aforementioned semiconductor photoresist composition on the thin film 102 formed on the substrate 100 and then, curing it through a heat treatment.

In some embodiments, the formation of a pattern by using the semiconductor photoresist composition may include coating the semiconductor photoresist composition on the substrate 100 having the thin film 102 through spin coating, slit coating, inkjet printing, and/or the like and then, drying it to form the photoresist layer 106.

The semiconductor photoresist composition has already been described in detail and duplicative description thereof will not be repeated here.

Subsequently, a substrate 100 having the photoresist layer 106 is subjected to a first baking process. The first baking process may be performed at about 80° C. to about 120° C.

Figure 3:
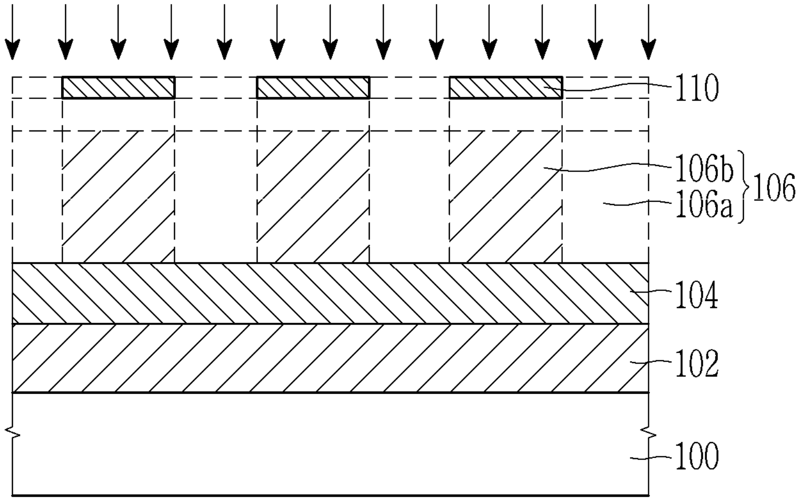

Referring to FIG. 3, the photoresist layer 106 may be selectively exposed.

For example, the exposure may use an activation radiation with light having a high energy wavelength such as EUV (extreme ultraviolet; a wavelength of about 13.5 nm), an E-Beam (an electron beam), and/or the like as well as a short wavelength such as an i-line (a wavelength of about 365 nm), a KrF excimer laser (a wavelength of about 248 nm), an ArF excimer laser (a wavelength of about 193 nm), and/or the like.

Light for the exposure according to embodiments may have a short wavelength in a range from about 5 nm to about 150 nm and a high energy wavelength, for example, EUV (extreme ultraviolet; a wavelength of 13.5 nm), an E-Beam (an electron beam), and/or the like.

The exposed region **106*b* of the photoresist layer 106 has a different solubility from the non-exposed region 106*a* of the photoresist layer 106 by forming a polymer in the exposed region 106*b*** by a crosslinking reaction such as condensation between organometallic compounds.

Subsequently, the substrate 100 is subjected to a second baking process. The second baking process may be performed at a temperature of about 90° C. to about 200° C. The exposed region **106*b* of the photoresist layer 106** becomes easily indissoluble regarding (e.g., insoluble in) a developing solution due to the second baking process.

Figure 4:
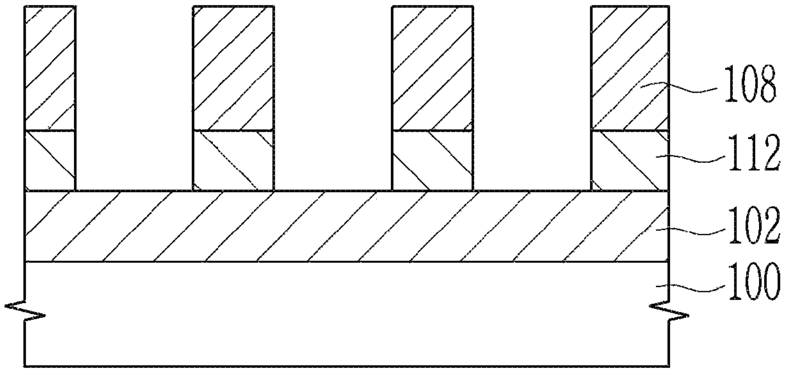

In FIG. 4, the non-exposed region **106*a* of the photoresist layer is dissolved and removed using the developing solution to form a photoresist pattern 108. In some embodiments, the non-exposed region 106*a* of the photoresist layer is dissolved and removed by using an organic solvent such as 2-heptanone and/or the like to complete the photoresist pattern 108** corresponding to the negative tone image.

As described above, a developing solution used in a method of forming patterns according to embodiments may be an organic solvent. The organic solvent used in the method of forming patterns according to embodiments may be, for example, ketones, such as methylethylketone, acetone, cyclohexanone, 2-heptanone, and/or the like, alcohols such as 4-methyl-2-propanol, 1-butanol, isopropanol, 1-propanol, methanol, and/or the like, esters such as propylene glycol monomethyl ether acetate, ethyl acetate, ethyl lactate, n-butyl acetate, butyrolactone, and/or the like, aromatic compounds such as benzene, xylene, toluene, and/or the like, or a combination thereof.

However, the photoresist pattern according to embodiments is not necessarily limited to the negative tone image but may be formed to have a positive tone image. Herein, a developing agent used for forming the positive tone image may be a quaternary ammonium hydroxide composition such as tetraethylammonium hydroxide, tetrapropylammonium hydroxide, tetrabutylammonium hydroxide, or a combination thereof.

As described above, exposure to light having a high energy such as EUV (extreme ultraviolet; a wavelength of 13.5 nm), an E-Beam (an electron beam), and/or the like as well as light having a wavelength such as i-line (wavelength of about 365 nm), KrF excimer laser (wavelength of about 248 nm), ArF excimer laser (wavelength of about 193 nm), and/or the like may provide a photoresist pattern 108 having a width of a thickness of about 5 nm to about 100 nm. For example, the photoresist pattern 108 may have a width of a thickness of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm.

In some embodiments, the photoresist pattern 108 may have a pitch of having a half-pitch of less than or equal to about 50 nm, for example, less than or equal to about 40 nm, for example, less than or equal to about 30 nm, for example, less than or equal to about 20 nm, or, for example, less than or equal to about 15 nm, and a line width roughness of less than or equal to about 10 nm, less than or equal to about 5 nm, less than or equal to about 3 nm, or less than or equal to about 2 nm.

Subsequently, the photoresist pattern 108 is used as an etching mask to etch the resist underlayer 104. Through this etching process, an organic layer pattern 112 is formed. The organic layer pattern 112 also may have a width corresponding to that of the photoresist pattern 108.

Figure 5:
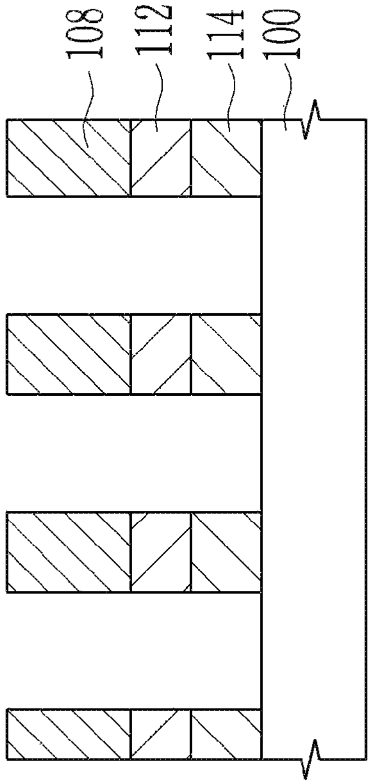

Referring to FIG. 5, the exposed thin film 102 is etched by applying the photoresist pattern 108 as an etching mask. As a result, the thin film is formed as a thin film pattern 114.

The etching of the thin film 102 may be, for example, dry etching using an etching gas and the etching gas may be, for example, $CHF_3$, $CF_4$, $Cl_2$, $BCl_3$, or a mixed gas thereof.

In the exposure process, the thin film pattern 114 formed by using the photoresist pattern 108 formed through the exposure process performed by using an EUV light source may have a width corresponding to that of the photoresist pattern 108. For example, the thin film pattern 114 may have a width of 5 nm to 100 nm which is equal to that of the photoresist pattern 108. For example, the thin film pattern 114 formed by using the photoresist pattern 108 formed through the exposure process performed by using an EUV light source may have a width of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, about 5 nm to about 20 nm, or, for example, a width of less than or equal to about nm, like that of the photoresist pattern 108.

Hereinafter, the subject matter of the present disclosure will be described in more detail through example embodiments of the preparation of the aforementioned semiconductor photoresist composition. However, the present disclosure is technically not restricted by the following examples.

EXAMPLES

Synthesis Example 1: Synthesis of Organotin Compound Represented by Chemical Formula 3

In a 250 mL 2-necked round-bottomed flask equipped with a Dean-Stark apparatus, n-butylstannoic acid (5 g, 0.024 mol), propionic acid (1.96 g, 0.026 mol), and toluene 216 mL were added at room temperature and then, heated under reflux at 130° C. for 12 hours. Subsequently, nonreaction reactants, the residual solvent, and water as a byproduct were removed under a reduced pressure, thereby obtaining a compound represented by Chemical Formula 3.

[Chemical Formula 3]

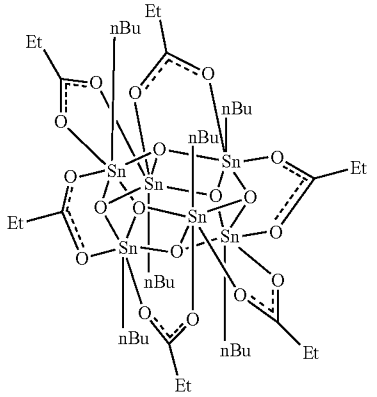

Synthesis Example 2: Synthesis of Organotin Compound Represented by Chemical Formula 4

A compound represented by Chemical Formula 4 was synthesized in substantially the same manner as in Synthesis Example 1 except that isobutyric acid (8.8 g, 0.1 mol) was used instead of the propionic acid.

[Chemical Formula 4]

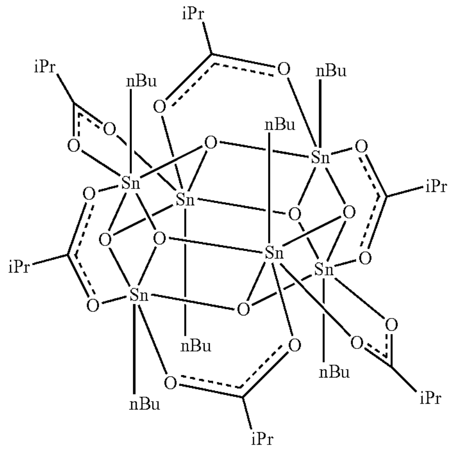

Synthesis Example 3: Synthesis of Organotin Compound Represented by Chemical Formula 5

A compound represented by Chemical Formula 5 was synthesized in substantially the same manner as in Synthesis Example 1 except that 3-methoxypropionic acid (10.4 g, 0.1 mol) was used instead of the propionic acid.

[Chemical Formula 5]

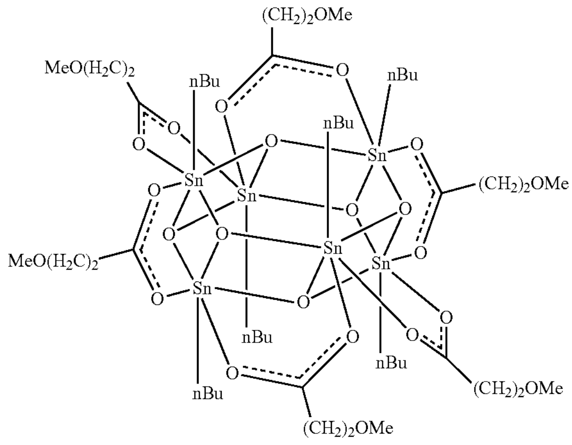

Synthesis Example 4: Synthesis of Organotin Compound Represented by Chemical Formula 6

A compound represented by Chemical Formula 6 was synthesized in substantially the same manner as in Synthesis Example 1 except that i-propylstannoic acid (19.5 g, 0.1 mol) was used instead of the n-butylstannoic acid.

[Chemical Formula 6]

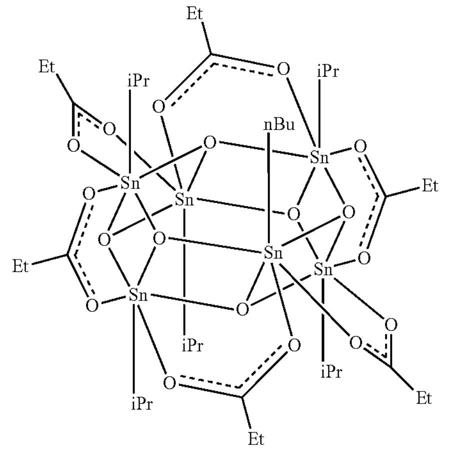

Synthesis Example 5: Synthesis of Organotin Compound Represented by Chemical Formula 7

A compound represented by Chemical Formula 7 was synthesized in substantially the same manner as in Synthesis Example 4 except that isobutyric acid (8.8 g, 0.1 mol) was used instead of the propionic acid.

[Chemical Formula 7]

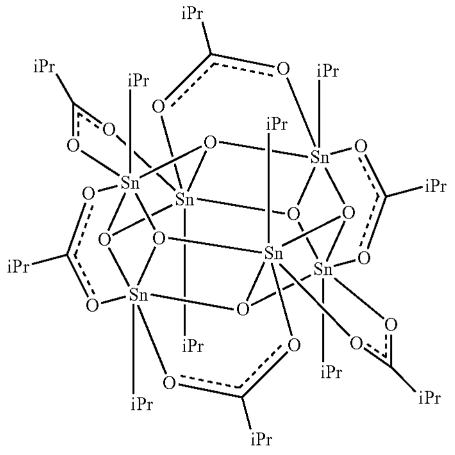

Synthesis Example 6: Synthesis of Organotin Compound Represented by Chemical Formula 8

A compound represented by Chemical Formula 8 was synthesized in substantially the same manner as in Synthesis Example 4 except that 3-methoxypropionic acid (10.4 g, 0.1 mol) was used instead of the propionic acid.

[Chemical Formula 8]

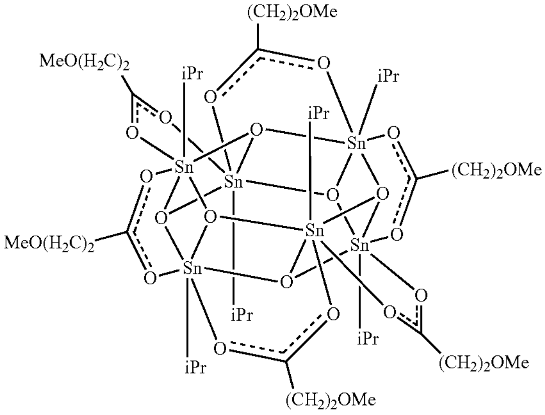

Synthesis Example 7: Synthesis of Organotin Compound Represented by Chemical Formula 9

A compound represented by Chemical Formula 9 was synthesized in substantially the same manner as in Synthesis Example 1 except that benzylstannoic acid (24 g, 0.1 mol) was used instead of the n-butylstannoic acid.

[Chemical Formula 9]

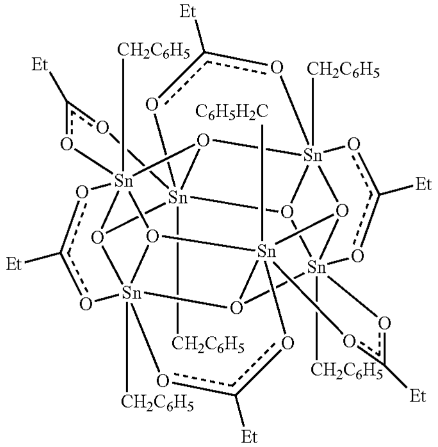

Synthesis Example 8: Synthesis of Organotin Compound Represented by Chemical Formula 10

A compound represented by Chemical Formula 10 was synthesized in substantially the same manner as in Synthesis Example 7 except that isobutyric acid (8.8 g, 0.1 mol) was used instead of the propionic acid.

[Chemical Formula 10]

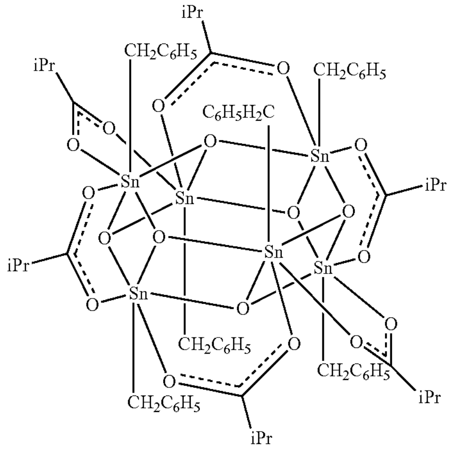

Synthesis Example 9: Synthesis of Organotin Compound Represented by Chemical Formula 11

A compound represented by Chemical Formula 11 was synthesized in substantially the same manner as in Synthesis Example 7 except that pivalic acid (10 g, 0.1 mol) was used instead of the propionic acid.

[Chemical Formula 11]

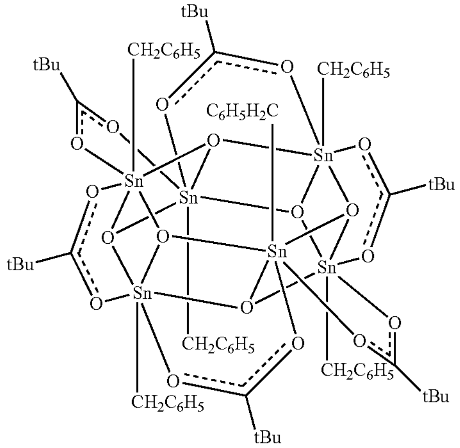

Synthesis Example 10: Synthesis of Organotin Compound Represented by Chemical Formula 12

A compound represented by Chemical Formula 12 was synthesized in substantially the same manner as in Synthesis Example 7 except that phenylacetic acid (13.6 g, 0.1 mol) was used instead of the propionic acid.

[Chemical Formula 12]

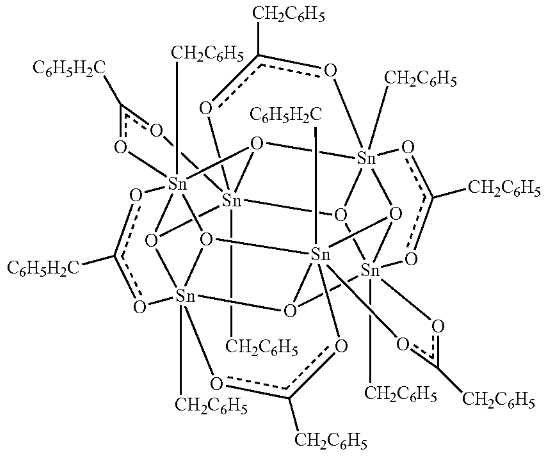

Synthesis Example 11: Synthesis of Organotin Compound Represented by Chemical Formula 13

A compound represented by Chemical Formula 13 was synthesized in substantially the same manner as in Synthesis Example 7 except that 3-methoxypropionic acid (10.4 g, 0.1 mol) was used instead of the propionic acid.

[Chemical Formula 13]

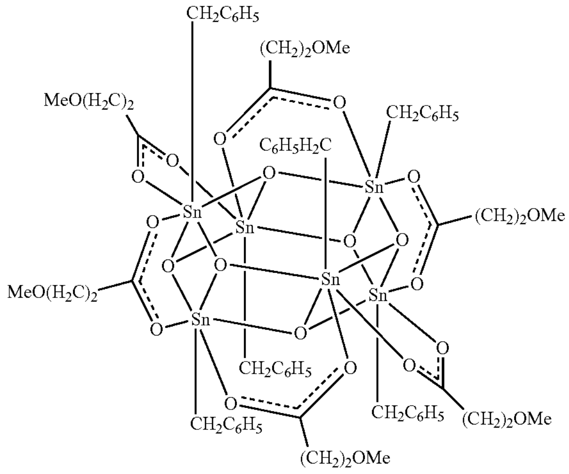

Comparative Synthesis Example 1: Synthesis of Organotin Compound Represented by Chemical Formula 14

$nBuSnCl_3$ (8.5 g, 30 mmol) was dissolved in anhydrous pentane and then, cooled to 0° C. Subsequently, triethylamine (10.0 g, 99 mmol) was slowly added thereto in a dropwise fashion, and ethanol (4.2 g, 90 mmol) was added thereto and then, stirred at room temperature for 5 hours. When a reaction was completed, the resultant was filtered, concentrated, and vacuum-dried, thereby obtaining a compound represented by Chemical Formula 14.

[Chemical Formula 14]

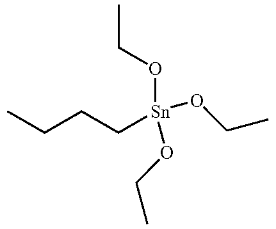

Comparative Synthesis Example 2: Synthesis of Compound Represented by Chemical Formula 15

A compound represented by Chemical Formula 15 was synthesized in substantially the same manner as in Comparative Synthesis Example 1 except that $BnSnCl_3$ was used instead of the $nBuSnCl_3$.

[Chemical Formula 15]

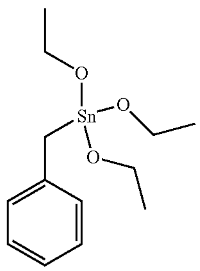

Comparative Synthesis Example 3: Synthesis of Compound Represented by Chemical Formula 16

Dibutyltin dichloride (10 g, 33 mmol) was dissolved in 30 mL of ether, and 70 mL of a 1 M sodium hydroxide (NaOH) aqueous solution was added thereto and then, stirred for 1 hour. After the stirring, a solid produced therein was filtered, three times washed with 25 mL of deionized water, and dried at 100° C. under a reduced pressure, obtaining an organometallic compound represented by Chemical Formula 16 and having a weight average molecular weight of 1,500 g/mol.

[Chemical Formula 16]

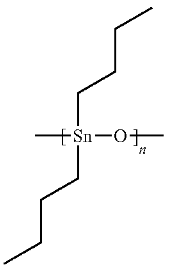

Examples 1 to 11

The compounds represented by Chemical Formulas 3 to 13 obtained in Synthesis Examples 1 to 11 were dissolved in 3 wt % of PGMEA (propylene glycol monomethyl ether acetate), and filtered with a 0.1 μm PTFE syringe filter to prepare each photoresist composition. A circular silicon wafer having a negative-oxide surface and a diameter of 4 inches was used as a substrate for depositing a thin film. Before depositing a resist thin film, the wafer was treated in a UV ozone cleaning system for 10 minutes, and the resist composition was spin-coated on the wafer at 1500 rpm for second and baked at 120° C. for 60 seconds, thereby forming a thin film. Subsequently, when the film after the coating and firing was measured with respect to a thickness after coating and baking through ellipsometry, the result was 25 nm.

Comparative Examples 1 to 3

Semiconductor photoresist compositions of Comparative Examples 1 to 3 and photoresist thin films including the same were prepared in substantially the same manners as in the examples except that the compounds represented by Chemical Formula 14 to 16 according to Comparative Synthesis Examples 1 to 3 were respectively dissolved in PGMEA (propylene glycol monomethyl ether acetate) at a concentration of 3 wt %. The thin films were measured with respect to a thickness after coating and baking, and the result was about 25 nm.

Evaluation 1: Evaluation of Storage Stability

The organometallic compounds used in Examples 1 to 11 and Comparative Examples 1 to 3 were evaluated with respect to storage stability according to the following criteria, and the results are shown in Table 1.

Storage Stability

The semiconductor photoresist compositions of Examples 1 to 11 and Comparative Examples 1 to 3 were allowed to stand at room temperature (20±5° C.) for a predetermined period and then, evaluated with naked eyes (unaided eye) according to the following two storage criteria with respect to how much precipitates were produced.

※ Evaluation criteria

○: Can be stored for 1 month or more

X: Can be stored for less than 1 month

Evaluation 2: Evaluation of Thermal Stability

The organometallic compounds used in Examples 1 to Example 11 and Comparative Examples 1 to 3 were measured with respect to an onset temperature when residual amount changes start through thermogravimetric analysis (TGA), and the results are shown in Table 1. As the onset temperature is higher, thermal stability is more excellent.

* Analysis condition: transport gas: argon (Ar), transport gas flow rate: 100 cc/min, temperature increase rate: 10° C./min, temperature range: 30° C. to 500° C.

TABLE 1

| | Storage stability | Thermal stability |
|---|---|---|
| Example 1 | ○ | 230° C. |
| Example 2 | ○ | 241° C. |
| Example 3 | ○ | 192° C. |
| Example 4 | ○ | 210° C. |
| Example 5 | ○ | 221° C. |
| Example 6 | ○ | 179° C. |
| Example 7 | ○ | 251° C. |
| Example 8 | ○ | 260° C. |
| Example 9 | ○ | 249° C. |
| Example 10 | ○ | 267° C. |
| Example 11 | ○ | 210° C. |
| Comparative Example 1 | X | 134° C. |
| Comparative Example 2 | X | 147° C. |
| Comparative Example 3 | X | 198° C. |

Referring to Table 1, the semiconductor photoresist compositions according to Examples 1 to 11 exhibited excellent storage stability and thermal stability, compared with semiconductor photoresist compositions according to Comparative Examples 1 to 3.

Hereinbefore, certain embodiments of the present disclosure have been described and illustrated, however, it should be apparent to a person having ordinary skill in the art that the subject matter of the present disclosure is not limited to the embodiments as described, and may be variously modified and transformed without departing from the spirit and scope of the present disclosure. Accordingly, the modified or transformed embodiments as such may not be understood separately from the technical ideas and aspects of the described embodiments of the present disclosure, and the modified embodiments are within the scope of the claims of the present disclosure, and equivalents thereof.

| Description of Symbols | |
|---|---|
| 100: substrate | 102: thin film |
| 104: resist underlayer | 106: photoresist layer |
| 106a: non-exposed region | 106b: exposed region |
| 108: photoresist pattern | 110: mask |
| 112: organic layer pattern | 114: thin film pattern |

What is claimed is:

1. A semiconductor photoresist composition, comprising:

an organometallic compound represented by Chemical Formula 1 and a solvent:

$$[R^1L^1SnO(R^2L^2C(=O)O)]_6 \quad \text{Chemical Formula 1}$$

wherein, in Chemical Formula 1, $R^1$ is a substituted or unsubstituted C1 to C20 alkyl group, a substituted or unsubstituted C1 to C20 alkoxy group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C31 arylalkyl group or a combination thereof, $R^2$ is a substituted or unsubstituted C1 to C20 alkyl group, a substituted or unsubstituted C1 to C20 alkoxy group, a substituted or unsubstituted C3 to C20 cycloalkyl group, a substituted or unsubstituted C2 to C20 alkenyl group, a substituted or unsubstituted C2 to C20 alkynyl group, or a combination thereof, and $L^1$ and $L^2$ are each independently a single bond or a substituted or unsubstituted C1 to C10 alkylene group, wherein:

in $R^2$, the substituted C1 to C20 alkyl group, the substituted C1 to C20 alkoxy group, the substituted C3 to C20 cycloalkyl group, the substituted C2 to C20 alkenyl group, or the substituted C2 to C20 alkynyl group, has at least one hydrogen atom is replaced by at least one of a hydroxy group, —NRR', a sulfonyl group, a thiol group, a ketone group, an aldehyde group, a C1 to C20 alkoxy group, or a combination thereof, and wherein, R and R' are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group.

2. The semiconductor photoresist composition of claim 1, wherein:

in $R^1$, the substituted C1 to C20 alkyl group, the substituted C1 to C20 alkoxy group, the substituted C3 to C20 cycloalkyl group, the substituted C2 to C20 alkenyl group, the substituted C2 to C20 alkynyl group, the substituted C6 to C30 aryl group or the substituted C7 to C31 arylalkyl group has at least one hydrogen atom is replaced by at least one of a hydroxy group, —NRR', a sulfonyl group, a thiol group, a ketone group, an aldehyde group, a C1 to C20 alkoxy group, or a combination thereof, wherein, R and R' are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group.

3. The semiconductor photoresist composition of claim 1, wherein:

the organometallic compound is represented by Chemical Formula 2:

Chemical Formula 2

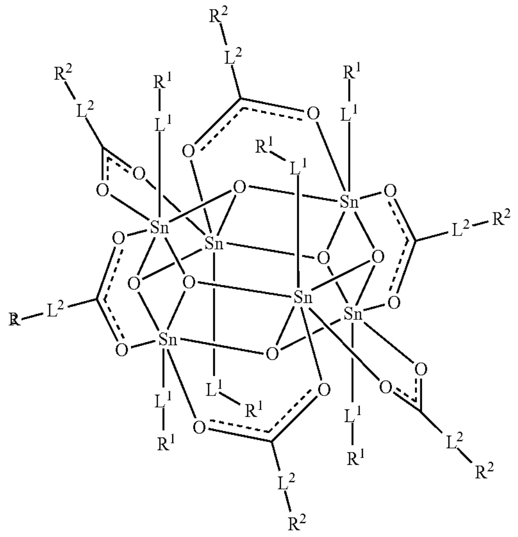

wherein, in Chemical Formula 2, $R^1$ is a substituted or unsubstituted C1 to C20 alkyl group, a substituted or unsubstituted C1 to C20 alkoxy group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C31 arylalkyl group or a combination thereof, $R^2$ is a substituted or unsubstituted C1 to C20 alkyl group, a substituted or unsubstituted C1 to C20 alkoxy group, a substituted or unsubstituted C3 to C20 cycloalkyl group, a substituted or unsubstituted C2 to C20 alkenyl group, a substituted or unsubstituted C2 to C20 alkynyl group, or a combination thereof, and $L^1$ and $L^2$ are each independently a single bond or a substituted or unsubstituted C1 to C10 alkylene group.

4. The semiconductor photoresist composition of claim 1, wherein:

$R^1$ is a substituted or unsubstituted C1 to C20 alkyl group, a substituted or unsubstituted C1 to C20 alkoxy group, a substituted or unsubstituted C6 to C30 aryl group, a substituted or unsubstituted C7 to C31 arylalkyl group or a combination thereof, and $R^2$ is a substituted or unsubstituted C1 to C20 alkyl group, a substituted or unsubstituted C1 to C20 alkoxy group, or a combination thereof.

5. The semiconductor photoresist composition of claim 1, wherein:

$R^1$ is a substituted or unsubstituted C1 to C10 alkyl group or a substituted or unsubstituted C7 to C19 arylalkyl group, and $R^2$ is a substituted or unsubstituted C1 to C10 alkyl group.

6. The semiconductor photoresist composition of claim 1, wherein:

$R^1$ is a methyl group, an ethyl group, a propyl group, a butyl group, an isopropyl group, a tert-butyl group, a 2,2-dimethylpropyl group, a benzyl group, or a combination thereof, and $R^2$ is a methyl group, an ethyl group, a propyl group, a butyl group, an isopropyl group, a tert-butyl group, a 2,2-dimethylpropyl group, or a combination thereof.

7. The semiconductor photoresist composition of claim 1, wherein:

$L^1$ and $L^2$ are each independently a single bond or a substituted or unsubstituted C1 to C5 alkylene group.

8. The semiconductor photoresist composition of claim 1, wherein:

the organometallic compound comprises any one of compounds of Group 1 or a combination thereof:

[Group 1]

Chemical Formula 3

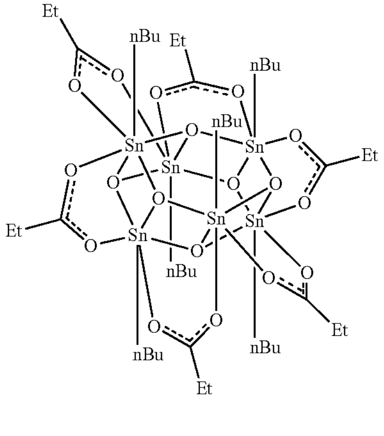

-continued
Chemical Formula 4
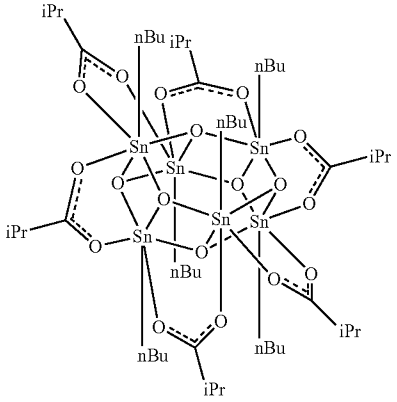
Chemical Formula 5
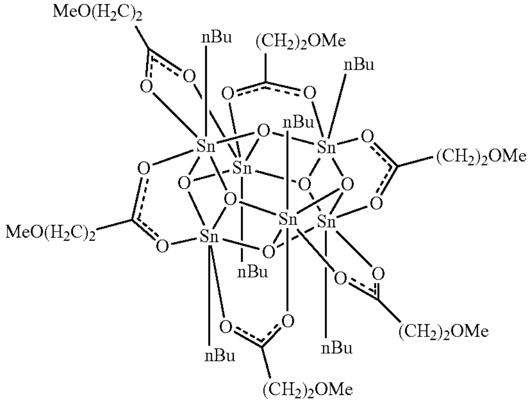
Chemical Formula 6
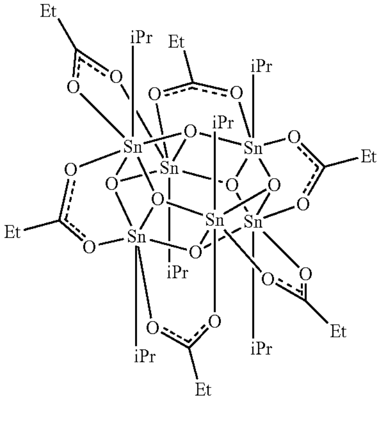
-continued
Chemical Formula 7
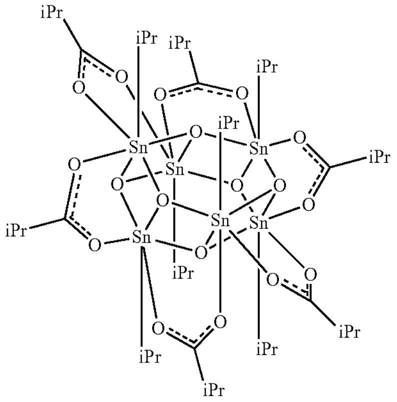
Chemical Formula 8
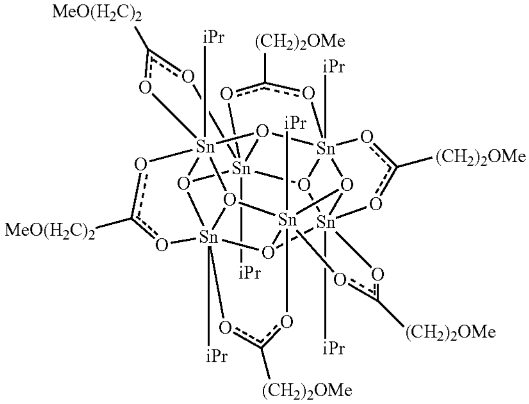
Chemical Formula 9
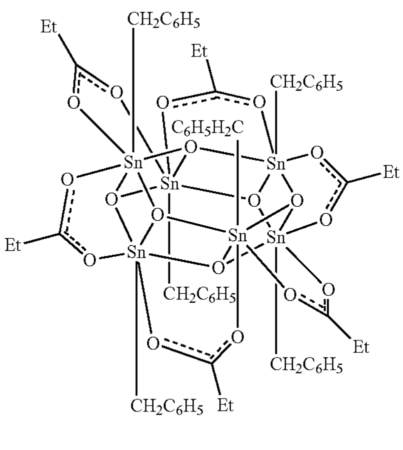

-continued

Chemical Formula 10

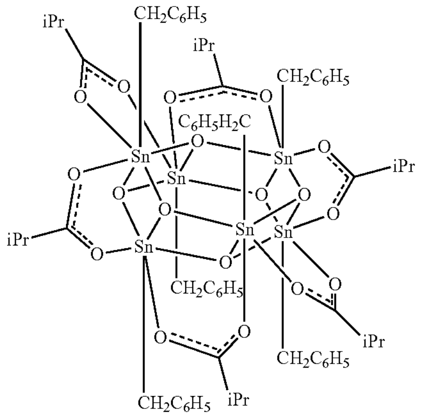

Chemical Formula 11

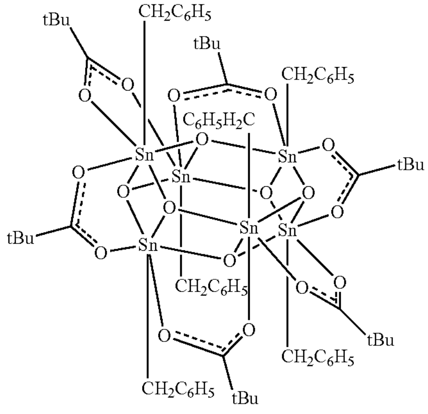

Chemical Formula 12

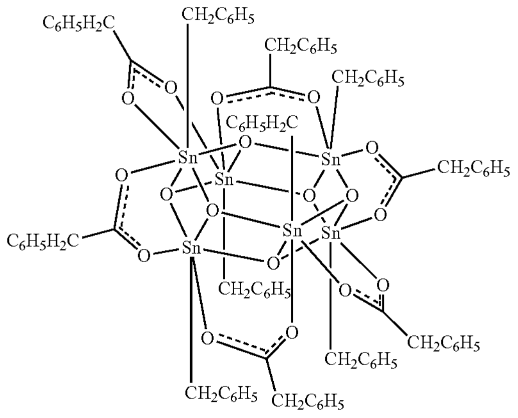

-continued

Chemical Formula 13

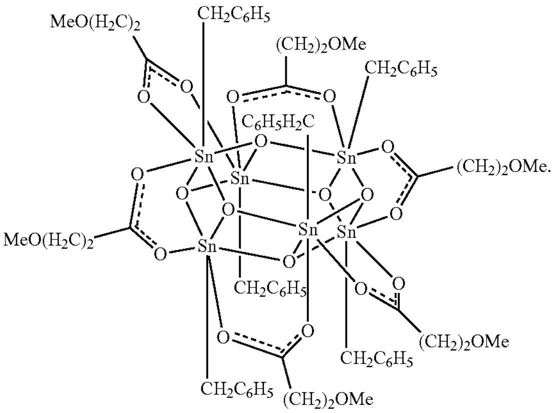

9. The semiconductor photoresist composition of claim 1, wherein:

the semiconductor photoresist composition comprises about 1 wt % to about 30 wt % of the organometallic compound represented by Chemical Formula 1, based on 100 wt % of the semiconductor photoresist composition.

10. The semiconductor photoresist composition of claim 1, wherein:

the semiconductor photoresist composition further comprises an additive of a surfactant, a crosslinking agent, a leveling agent, or a combination thereof.

11. A method of forming patterns, comprising:

forming an etching-objective layer on a substrate;

coating the semiconductor photoresist composition of claim 1 on the etching-objective layer to form a photoresist layer;

patterning the photoresist layer to form a photoresist pattern; and etching the etching-objective layer using the photoresist pattern as an etching mask.

12. The method of claim 11, wherein the photoresist pattern is formed using light having a wavelength of about 5 nm to about 150 nm.

13. The method of claim 11, wherein:

the method further comprises providing a resist underlayer formed between the substrate and the photoresist layer.

14. The method of claim 11, wherein:

the photoresist pattern has a width of about 5 nm to about 100 nm.

* * * * *